(12) United States Patent
Magera et al.

(10) Patent No.: US 8,581,481 B1
(45) Date of Patent: Nov. 12, 2013

(54) PRE-ALIGNED THERMIONIC EMISSION ASSEMBLY

(75) Inventors: Gerald Magera, Hillsboro, OR (US);
William Mackie, McMinnville, OR (US); Larry Southall, McMinnville, OR (US); Gary Cabe, McMinnville, OR (US); Cory Fast, McMinnville, OR (US)

(73) Assignee: Applied Physics Technologies, Inc., McMinnville, OR (US)

( * ) Notice: Subject to any disclaimer, the term of this patent is extended or adjusted under 35 U.S.C. 154(b) by 160 days.

(21) Appl. No.: 13/035,707

(22) Filed: Feb. 25, 2011

(51) Int. Cl.
*H01J 9/02* (2006.01)
(52) U.S. Cl.
USPC .......................................... 313/310; 313/311
(58) Field of Classification Search
USPC .................................................. 313/310, 311
See application file for complete search history.

(56) References Cited

U.S. PATENT DOCUMENTS

| | | | |
|---|---|---|---|
| 3,478,244 A | | 11/1969 | Meyer et al. |
| 4,019,077 A | * | 4/1977 | Sakitani ........................ 313/441 |
| 4,401,919 A | | 8/1983 | Weiss |
| 5,238,527 A | | 8/1993 | Otani et al. |
| 5,536,944 A | * | 7/1996 | Tsunoda et al. ........... 250/423 F |
| 5,837,165 A | | 11/1998 | Otani et al. |
| 5,854,490 A | * | 12/1998 | Ooaeh et al. ............. 250/492.23 |
| 6,509,570 B1 | * | 1/2003 | Hirokawa et al. ......... 250/423 R |
| 6,710,338 B2 | * | 3/2004 | Gerlach et al. .................. 850/16 |
| 6,903,499 B2 | | 6/2005 | Terui et al. |
| 6,963,160 B2 | | 11/2005 | Schueller et al. |
| 7,005,651 B2 | * | 2/2006 | Kaga et al. ................ 250/423 R |
| 2002/0117967 A1 | * | 8/2002 | Gerlach et al. ............... 315/13.1 |
| 2006/0226753 A1 | * | 10/2006 | Adamec et al. ............... 313/310 |
| 2008/0211376 A1 | * | 9/2008 | Yasuda et al. ................. 313/414 |
| 2010/0301736 A1 | * | 12/2010 | Morishita et al. ............. 313/341 |

* cited by examiner

*Primary Examiner* — Nimeshkumar Patel
*Assistant Examiner* — Thomas A Hollweg
(74) *Attorney, Agent, or Firm* — Stoel Rives LLP

(57) ABSTRACT

A thermionic emission assembly includes a Wehnelt cap that has a cap beam aperture and a cavity within which a cathode is supported. Electrical energy applied to the cathode causes it to reach a sufficiently high temperature to emit a beam of electrons that propagate through the cap beam aperture. An anode having an anode beam aperture is positioned in spatial alignment with the cap beam aperture to receive the electrons. The anode accelerates the electrons and directs them through the anode beam aperture for incidence on a target specimen. A ceramic base forms a combined interface that electrically and thermally separates the Wehnelt cap and the anode. The interface thermally isolates the Wehnelt cap from the anode to allow the cathode to rapidly reach the sufficiently high temperature to emit the beam of electrons.

8 Claims, 9 Drawing Sheets

PRE-ALIGNED THERMIONIC EMISSION ASSEMBLY

COPYRIGHT NOTICE

© 2011 Applied Physics Technologies. A portion of the disclosure of this patent document contains material to which a claim for copyright is made. The copyright owner has no objection to the facsimile reproduction by anyone of the patent document or the patent disclosure, as it appears in the file or records of the U.S. Patent and Trademark Office, but reserves all other copyright rights whatsoever.

TECHNICAL FIELD

This disclosure relates generally to electron emitters and, in particular, to a thermionic emission assembly for generating an electron beam.

BACKGROUND INFORMATION

Various electron emitters or "sources" are used in equipment such as electron beam microscopes. Source alignment conventionally is performed by manual alignment of several individual piece part assemblies during operation.

At the expense of lifetime, the cathode is never turned off to avoid long emission stability delays. In other words, the cathode remains operating to avoid a time-consuming wait for stable operation to be reached before source alignment can be performed.

SUMMARY OF THE DISCLOSURE

A preferred embodiment of a thermionic emission assembly includes a Wehnelt cap that has a cap beam aperture and an interior region within which a cathode is supported. Electrical energy applied to the cathode causes it to reach a sufficiently high temperature to emit a beam of electrons that propagate through the cap beam aperture. An anode having an anode beam aperture is positioned in spatial alignment with the cap beam aperture to receive the electrons propagating through the cap beam aperture. The anode accelerates the electrons and directs them through the anode beam aperture for incidence on a target specimen. A ceramic base is positioned in the assembly to form a combined interface that electrically and thermally separates the Wehnelt cap and the anode. The interface thermally isolates, in absence of substantial heat dissipation, the Wehnelt cap from the anode to allow the cathode to rapidly reach the sufficiently high temperature to emit the beam of electrons.

Additional aspects and advantages will be apparent from the following detailed description of preferred embodiments, which proceeds with reference to the accompanying drawings.

DETAILED DESCRIPTION OF PREFERRED EMBODIMENTS

With reference to the above-listed drawings, this section describes particular embodiments and their detailed construction and operation. The embodiments described herein are set forth by way of illustration only and not limitation. Skilled persons will recognize in light of the teachings herein that there is a range of equivalents to the example embodiments described herein. Most notably, other embodiments are possible, variations can be made to the embodiments described herein, and there may be equivalents to the components, parts, or steps that make up the described embodiments.

For the sake of clarity and conciseness, certain aspects of components or steps of certain embodiments are presented without undue detail where such detail would be apparent to skilled persons in light of the teachings herein and/or where such detail would obfuscate an understanding of more pertinent aspects of the embodiments.

As skilled persons will appreciate in light of this disclosure, certain embodiments are capable of achieving certain advantages over the known prior art, including some or all of the following: (1) pre-alignment of a cathode, Wehnelt cap, and anode assembly; (2) relatively low mass and thermally isolated Wehnelt cap for shorter duration to reach stable operation; (3) reduced component part count for an electron gun module; (4) use of a one-piece ceramic disk for electrical and thermal isolation of the Wehnelt cap and anode; (5) reduced manufacturing costs for a thermionic emission assembly; (6) relative ease of manufacturing a thermionic emission assembly; and (7) a drop-in, field-replaceable thermionic emission assembly. These and other advantages of various embodiments will be apparent throughout the following detailed description.

Figure 1:
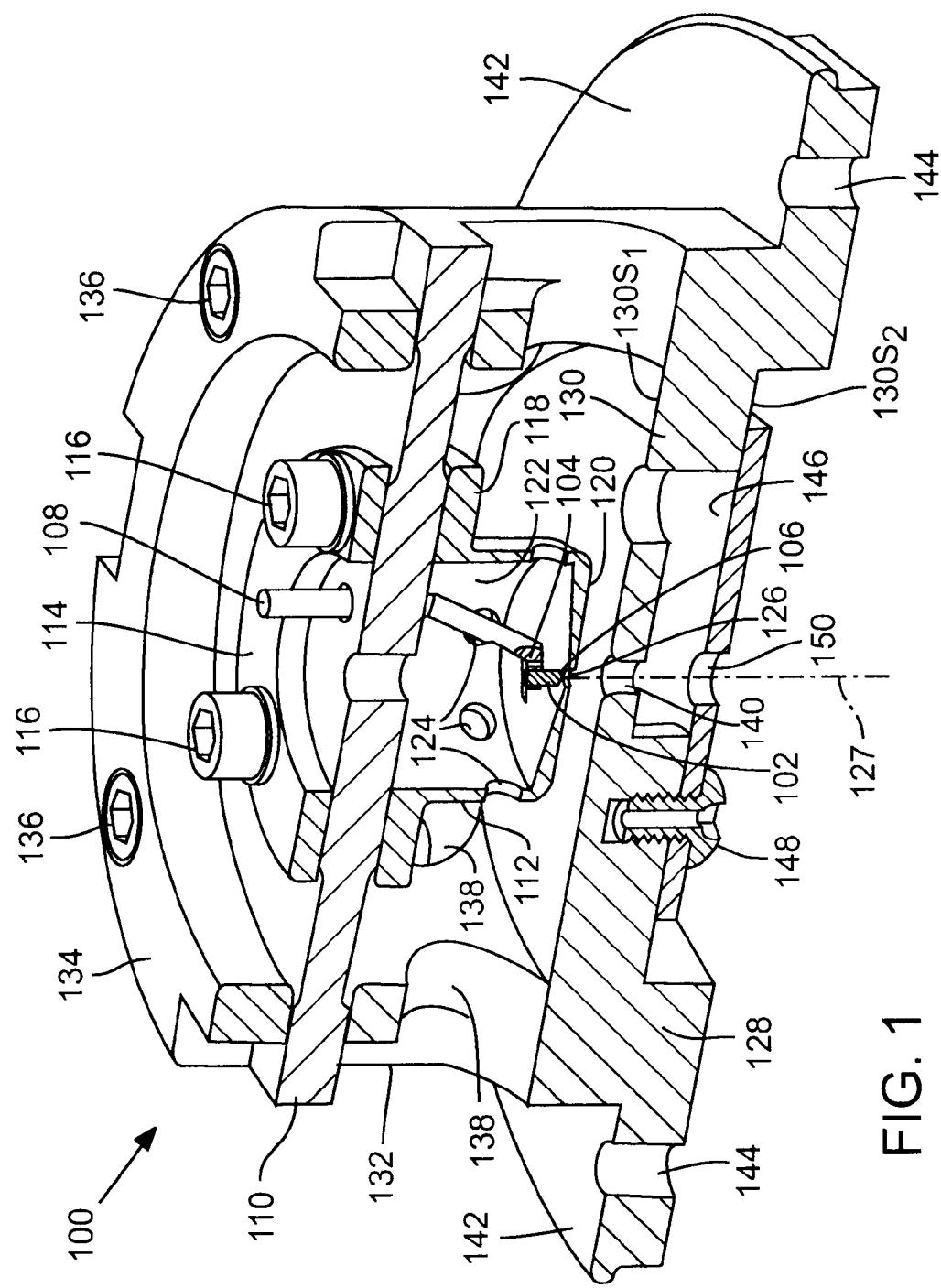
FIG. 1 is a perspective pictorial view showing in cross-section a thermionic emission assembly according to one embodiment.
Figure 2:
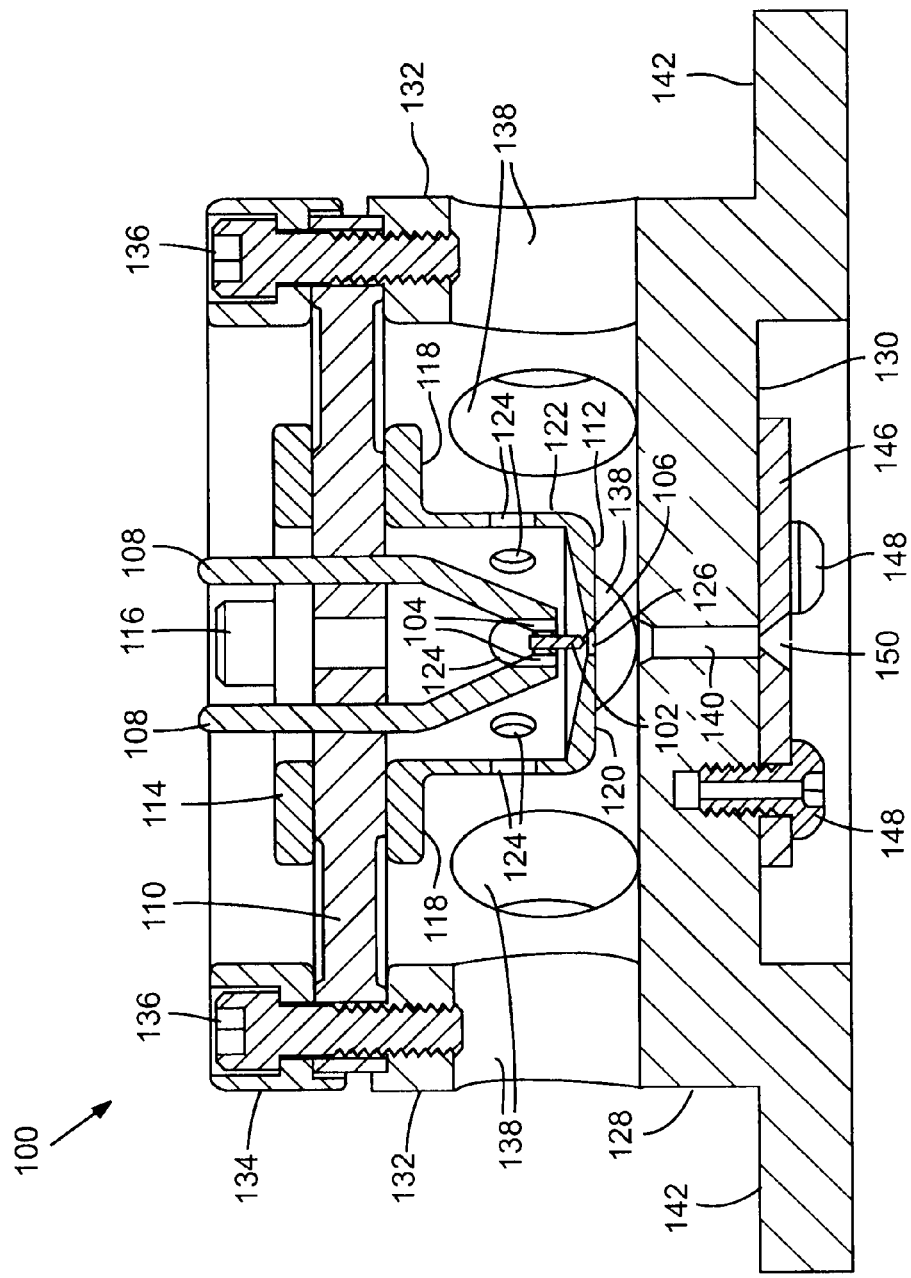
FIG. 2 is an enlarged cross-sectional view of the thermionic emission assembly of FIG. 1.

FIG. 1 is a cross-sectional pictorial view of a thermionic emission assembly 100 according to one embodiment. FIG. 2 is an enlarged cross sectional view of assembly 100 that is rotated relative to FIG. 1 to show two filament posts. Assembly 100 may be used in a number of different instruments or applications that are operationally enabled by use of an electron beam. Such applications include, but are not limited to, a scanning electron microscope (SEM), a transmission electron microscope (TEM), surface analysis and metrology, and high current applications (microwave tubes, lithography, electron-beam welders, X-ray sources, and free electron lasers).

Figure 3:
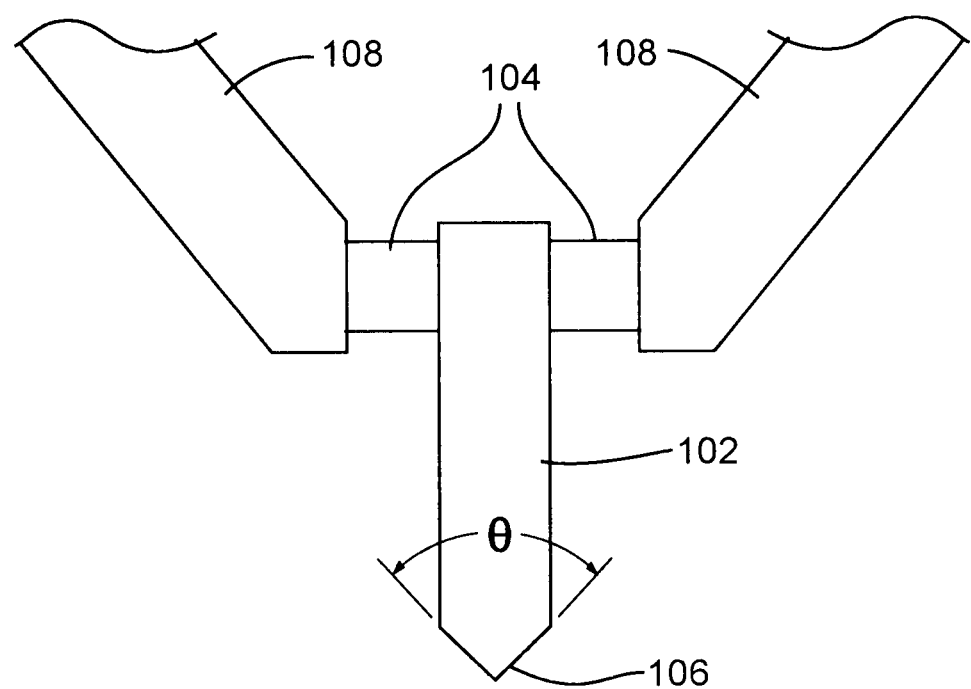
FIG. 3 is an enlarged fragmentary view of a cathode, blocks, and filament posts of the thermionic emission assembly of FIG. 1.

Assembly 100 is typically operated in a vacuum (e.g., $1\times10^{-7}$ Torr). FIG. 3 is an enlarged diagram of a portion of assembly 100 showing a cathode 102 held between a pair of blocks 104. Cathode 102 may be a hexaboride cathode such as a cerium hexaboride ($CeB_6$) cathode or a lanthanum hexaboride ($LaB_6$) cathode. Cathode 102 may have a <100> crystal orientation and a diameter from about 0.254 mm to about 1.27 mm, preferably from about 0.38 mm to about 0.77 mm. Cathode 102 includes an end portion 106 from which electrons are emitted. The shape and dimensions of cathode 102 may be different for various applications to achieve different beam currents, spot sizes, and brightness. For example, end portion 106 may be formed to have a cone angle θ of approximately 90° and a tip diameter from about 16 µm to about 25 µm to provide a relatively high beam current. Alternatively, end portion 106 may have a smaller cone angle (e.g., 60°) and tip diameter (e.g., 5 µm) to form a beam having high brightness and a small spot size. Moreover, cathode 102 may have a <310> crystal orientation and may be configured as a "tophat" cathode to form a beam having a large current and large spot size.

Blocks 104 may be made of pyrolytic graphite and may act as resistive heaters. Blocks 104 help to thermally isolate a pair of filament posts 108 from cathode 102 (only one filament post 108 shown in FIG. 1). The thickness of blocks 104 is preferably from about 0.25 mm to about 0.39 mm to provide different thermal isolation characteristics. Filament posts 108 are electrically connected to cathode 102 and are bent toward each other in a "V" shape to compressively hold cathode 102 in place. The mount configuration of filament posts 108 and cathode 102 may be a shunted mini vogel mount (SMVM) configuration or a mini vogel mount (MVM) configuration. Filament posts 108 may be made of a material, such as molybdenum or molybdenum-rhenium alloy, that maintains a high modulus of elasticity even at high temperatures.

Filament posts 108 extend from blocks 104 through a disk-shaped ceramic base 110. Filament posts 108 are rigidly fixed to ceramic base 110, which serves as a base for cathode 102 and filament posts 108. Thus, blocks 104 and filament posts 108 form a support structure for cathode 102, which is mechanically coupled to ceramic base 110. Ceramic base 110 is made of any ceramic material such as alumina (98.5%). Ceramic base 110 has a thickness from about 1.5 mm to about 2.5 mm. The ceramic material is chosen because of its electrical insulating, high strength, and high temperature survivability properties.

A Wehnelt cap 112 is attached to ceramic base 110. Wehnelt cap 112 may be made of titanium alloy (e.g., Ti6Al4V), titanium, or stainless steel. Wehnelt cap 112 is attached to ceramic base 110 by a field ring 114 and screws 116. Field ring 114 is provided on a side of ceramic base 110 opposite from Wehnelt cap 112, and screws 116 extend through ceramic base 110 between a flange 118 of Wehnelt cap 112 and field ring 114. Ceramic base 110 provides electrical and thermal isolation between Wehnelt cap 112 and filament posts 108. A negative voltage (e.g., −400 V) is applied to Wehnelt cap 112 relative to cathode 102 to suppress electron emission anywhere from cathode 102 other than its end portion 106. Flange 118 may be mounted flush against ceramic base 110, or a height adjustment ring (not shown) may be positioned between flange 118 and ceramic base 110. Wehnelt cap 112 forms an interior region or a cavity that surrounds cathode 102, blocks 104, and portions of filament posts 108. Wehnelt cap 112 has a top side 120 and a side wall 122 that extends between flange 118 and top side 120. Side wall 122 may include one or more vent holes 124, slots, or windows (slots and windows not shown). Side wall 122 has a preferred thickness from about 0.25 mm to about 1.02 mm. The thickness of side wall 122 and the configuration of vent holes 124, slots, or windows affect thermal paths to provide more or less thermal isolation for top side 120 relative to flange 118 and other components of assembly 100. For example, a relatively thin side wall 122 can provide for top side 120 a higher operating temperature than that provided by a thicker side wall 122. A relatively thin side wall 122 can also provide between top side 120 and flange 118 a bigger thermal difference than that provided by a thicker side wall 122. A high operating temperature for top side 120 may decrease the likelihood for oxide build up on it.

Top side 120 includes a cap beam aperture 126 located at a center portion so as to be coaxially aligned with end portion 106 of cathode 102 when Wehnelt cap 112 and filament posts 108 are fixed to ceramic base 110. The thickness of top side 120 tapers from about 0.5 mm to about 0.125 mm from side wall 122 to the center portion where aperture 126 is located. Aperture 126 functions to allow electrons emitted from cathode 102 and traveling along a beam axis or path 127 to pass out of Wehnelt cap 112. Wehnelt cap 112 and cathode 102 are configured so that, prior to operation, end portion 106 of cathode 102 is set back from the center portion of top side 120 at a predetermined gap distance. For example, the gap distance may be in a range from about 200 µm to about 300 µm, and preferably about 250 µm. When assembly 100 is first turned on and various parts of assembly 100 (e.g., cathode 102, blocks 104, filament posts 108, ceramic base 110, Wehnelt cap 112) heat up, the gap distance changes as a result of expansion of the various parts until the temperatures of the various parts become relatively stable. The gap distance affects operating characteristics such as emission current, crossover, and crossover location. The design of Wehnelt cap 112 allows it to increase in heat to a stable temperature relatively quickly. The amount of time between start-up (i.e., the time when electron emission from cathode 102 begins) and stable operation of assembly 100 is reduced compared to that of conventional electron emitters. Thus, assembly 100 makes more practical the turning off of cathode 102 when it is not in use.

Assembly 100 also includes an anode 128 attached to ceramic base 110. Anode 128 functions to accelerate electrons that pass through aperture 126 of Wehnelt cap 112. Anode 128 may be made of aluminum alloy (e.g., Ti6Al4V) or aluminum-copper alloy (CuAl) and functions as a thermal ground for assembly 100. Anode 128 includes a base portion 130 having a first surface $130S_1$, facing an outer surface of bottom side 120 of Wehnelt cap 112. First surface $130S_1$, of base portion 130 is relatively flat and substantially parallel to the outer surface of top side 120. Anode 128 includes a spacer ring 132 that extends from base portion 130 to ceramic base 110 and that encircles Wehnelt cap 112. A clamp ring 134 mounted on a side of ceramic base 110 opposite anode 128 attaches it to ceramic base 110. Screws 136 extend from clamp ring 134 to spacer ring 132 through ceramic base 110. Ceramic base 110 provides electrical and thermal isolation between anode 128 and Wehnelt cap 112 (and filament posts 108). A negative voltage (e.g., −5,300 V) is applied to cathode 102 relative to anode 128 to produce a beam of electrons traveling along a beam path. Spacer ring 132 is sized to provide a predetermined sized space between first surface $130S_1$, of base portion 130 and the outer surface of top side 120 of Wehnelt cap 112. For example, the space between base portion 130 and top side 120 may be in a range from about 1.0 mm to about 2.0 mm, and preferably about 1.5 mm. Spacer ring 132 includes holes 138 or slots in its sidewall for pumping out the source region (i.e., the interior of Wehnelt cap 112) and for aligning Wehnelt cap 112.

Base portion 130 has an anode beam aperture 140 coaxially aligned with aperture 126 of Wehnelt cap 112. The diameter of aperture 140 may be in a range from about 1.0 mm to about 2.0 mm, and preferably about 1.5 mm. Aperture 140 allows electrons traveling along the beam path and passing through aperture 126 to pass through anode 128. Anode 128 includes a circumferential flange 142 that has openings 144 sized to receive support rods that attach anode 128 to thermal ground.

A differential pumping aperture (DPA) plate 146 is mounted on a second surface $130S_2$ of base portion 130 and is attached to anode 128 by screws 148. DPA plate 146 includes an aperture 150 coaxially aligned with aperture 140 and aperture 126 so as to allow the electron beam passing through apertures 140 and 126 to pass through DPA plate 146 and prevent reverse air flow into Wehnelt cap 112. (Cathode 102 operates at higher vacuum pressure than that at anode aperture 140.) The electron beam passing through aperture 150 impinges a target specimen of an instrument in which assembly 100 is installed.

The configuration of assembly 100 shown in FIGS. 1 and 2 affords a number of improvements over known electron sources. For example, because filament posts 108, Wehnelt cap 112, and anode 128 are attached to a common base—ceramic base 110—the components of assembly can be packaged together as an integrated structure and aligned prior to deployment in an instrument such as an electron microscope. Thus, for example, if an electron source of an electron microscope becomes defective, the defective source may be removed and assembly 100 may replace the defective source without the need to align the various parts of assembly 100 after it is installed in the electron microscope. Moreover, ceramic base 110 functions as a thermal insulator and thereby provides mutual thermal isolation of anode 128, Wehnelt cap 112, and filament posts 108. The placement of ceramic base 110 as the only component between Wehnelt cap 112 and anode 128 allows assembly 100 to achieve stable operation more quickly than that which is achieved by conventional systems. Additionally, the design of Wehnelt cap 112 facilitates a substantial reduction in the amount of time between start up and stable operation of assembly 100 compared to that of conventional systems. The thickness of flange 142 contributes to a limited extent the diminution of warm-up time attributable to the design of Wehnelt cap 112.

Emission Current and Temperature Testing

Figure 4:
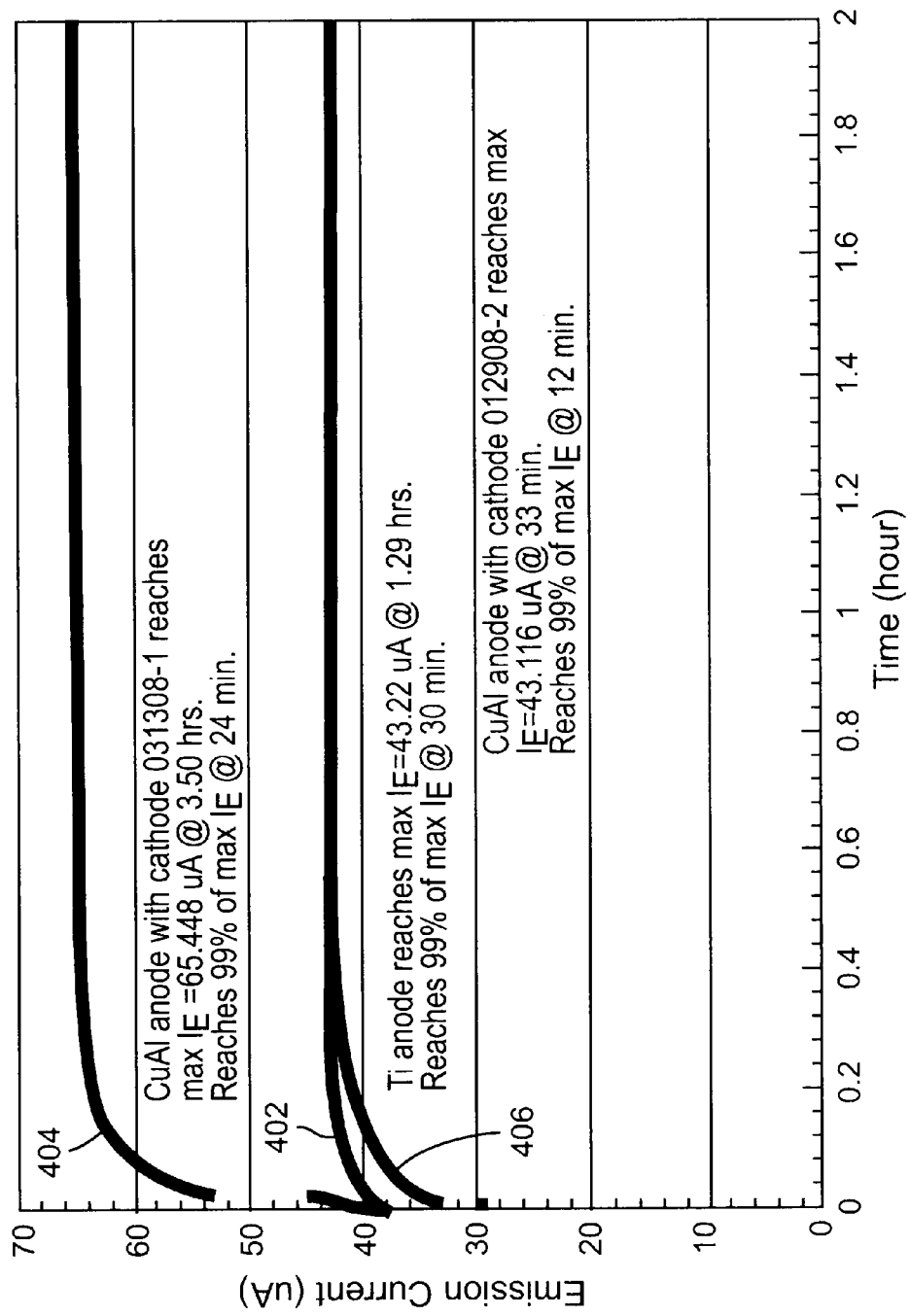
FIG. 4 is a graph of the emission currents of different embodiments of the thermionic emission assembly.

FIG. 4 is a graph of the emission current measured for three different embodiments of assembly 100 used in a SEM. For each embodiment, assembly 100 was first conditioned by placing 7.0 kilovolts (kV) between the cathode/Wehnelt cap assembly and anode 128. For each embodiment, cathode 102 was heated to approximately 1750 kelvin (K).

In a first embodiment, CuAl was used for Wehnelt cap 112 and anode 128. The thickness of side wall 122 of Wehnelt cap 112 was about 1.0 mm, and side wall 122 included eight equally spaced vent holes 124. The thickness of blocks 104 was set to about 0.25 mm. Curve 402 represents the emission current measured for the first embodiment. The emission current reached a maximum value of about 43 µA in 33 minutes after startup. The emission current reached 99% of its maximum value in approximately 12 minutes after startup.

In a second embodiment, CuAl was used for Wehnelt cap 112 and anode 128. The thickness of side wall 122 of Wehnelt cap 112 was about 0.25 mm, and side wall 122 included eight equally spaced vent holes 124. The thickness of blocks 104 was set to about 0.38 mm. Curve 404 represents the emission current measured for the second embodiment. (The discontinuity in curve 404 stems from a gap in the data collection process.) The emission current reached a maximum value of approximately 65.4 µA in 3.59 hours after startup. The emission current reached 99% of its maximum value in approximately 24 minutes after startup.

In a third embodiment, Ti6Al4V was used for Wehnelt cap 112 and anode 128. The thickness of side wall 122 of Wehnelt cap 112 was about 1.0 mm, and side wall 122 included eight equally spaced vent holes 124. The thickness of blocks 104 was set to about 0.25 mm. Curve 406 represents the emission current measured for the third embodiment. The emission current reached a maximum value of about 43 µA in 1.29 hours after startup. The emission current reached 99% of its maximum value in approximately 30 minutes after startup.

Figure 5:
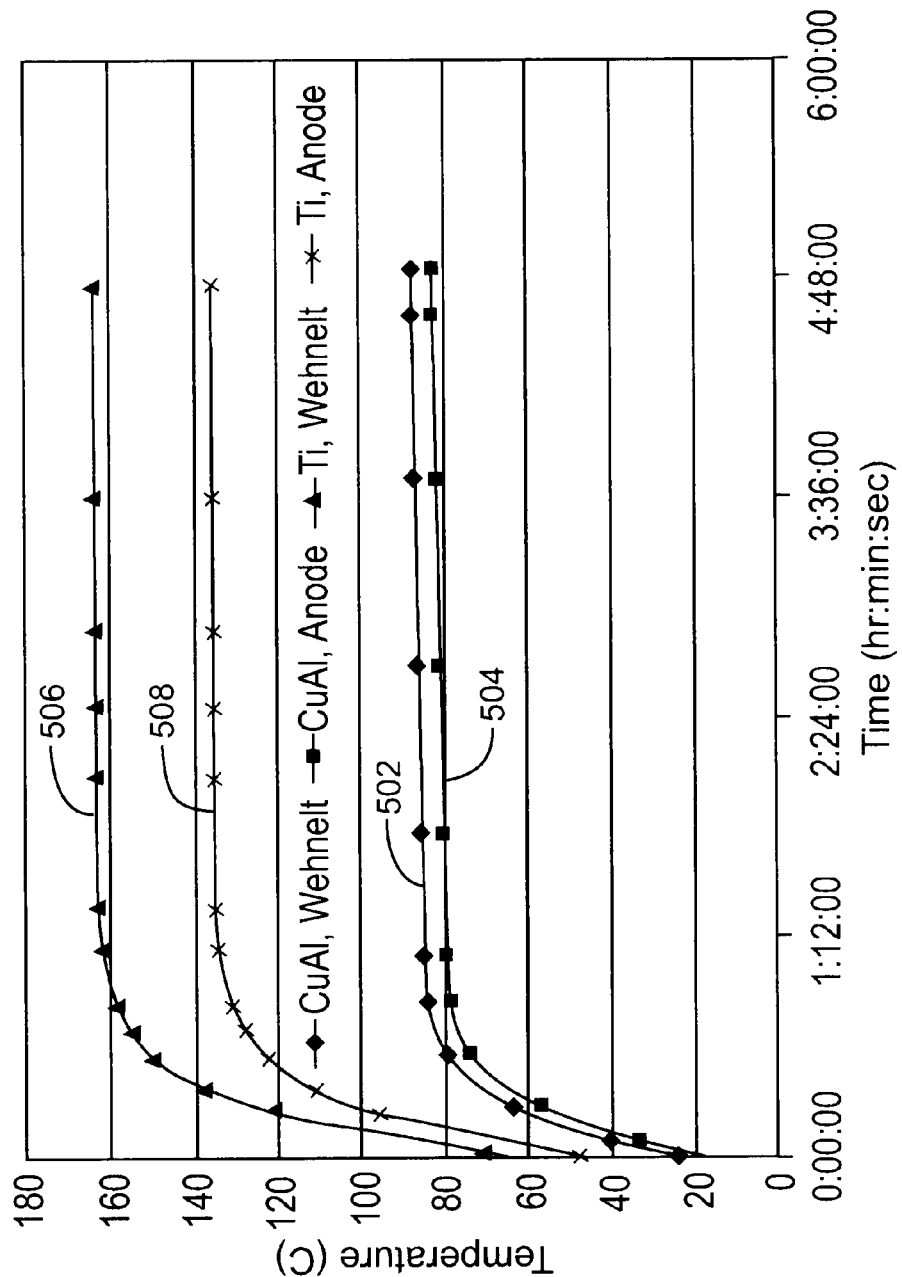
FIG. 5 is a graph of the operating temperatures of different embodiments of the thermionic emission assembly.

FIG. 5 is a graph of operating temperatures of Wehnelt cap 112 and anode 128 of the first and third embodiments. The temperatures of Wehnelt cap 112 and anode 128 were measured by thermocouples attached to field ring 114 and clamp ring 134. Curves 502 and 504 represent the temperatures of, respectively, Wehnelt cap 112 and anode 128 of the first embodiment. Curves 506 and 508 represent the temperatures of, respectively, Wehnelt cap 112 and anode 128 of the third embodiment. As shown in FIG. 5, Wehnelt cap 112 and anode 128 of the third embodiment stabilized at significantly higher temperatures than those of Wehnelt cap 112 and anode 128 of the first embodiment. Thus, the third embodiment may be less prone to oxide build up.

Figure 6:
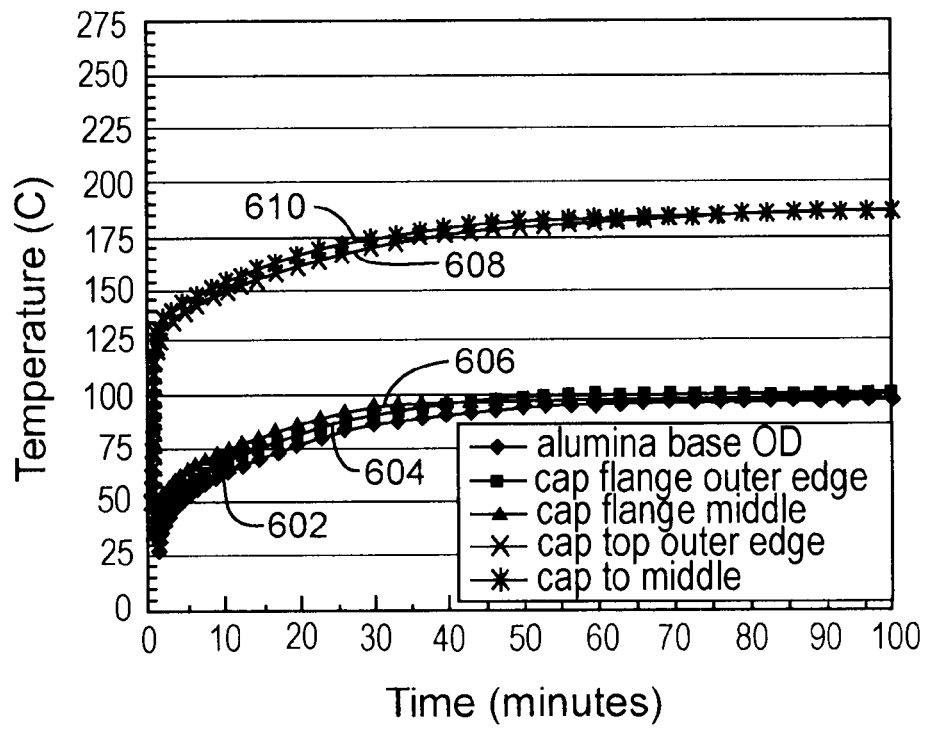
FIG. 6 is a graph of the operating temperatures of an embodiment of the thermionic emission assembly calculated by a thermal modeling program.
Figure 7:
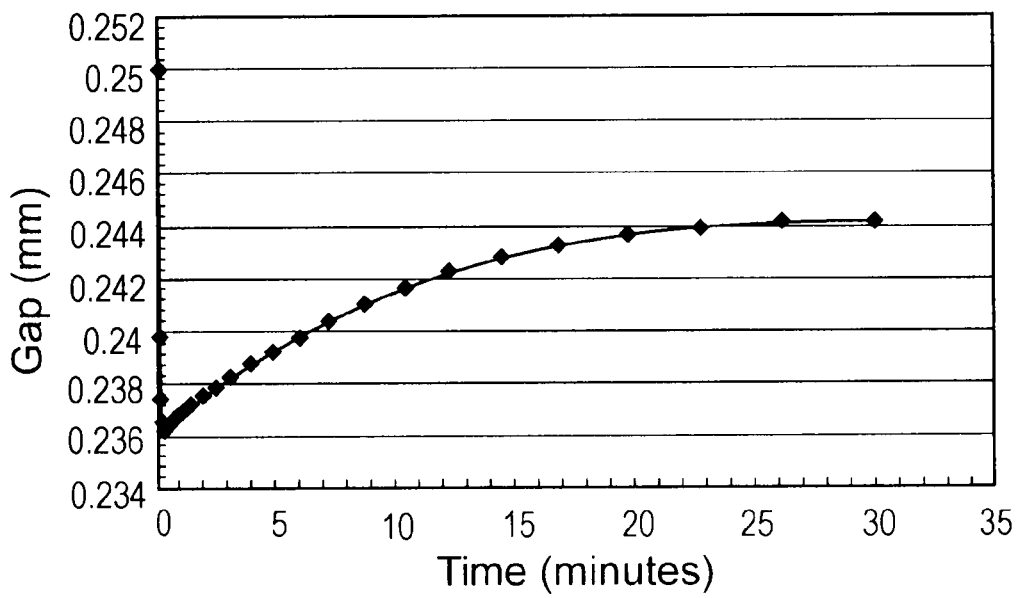
FIG. 7 is a graph of the gap distance between a cathode and a Wehnelt cap of the thermionic emission assembly according to one embodiment.

Thermal modeling software was also used to construct a thermal model for a fourth embodiment of assembly 100. In the fourth embodiment, Ti6Al4V was used for Wehnelt cap 112 and anode 128. The thickness of side wall 122 of Wehnelt cap 112 was about 0.5 mm, and side wall 122 included eight equally spaced vent holes 124. Results from the model are depicted in FIGS. 6 and 7. FIG. 6 is a graph of the temperatures of ceramic base 110 and different portions of Wehnelt cap 112, and FIG. 7 is a graph of the gap distance between end portion 106 of cathode 102 and first side 120 of Wehnelt cap 112. Curve 602 represents the temperature of ceramic base 110, curve 604 represents the temperature of an outer portion of flange 118, curve 606 represents the temperature of a middle portion of flange 118, curve 608 represents the temperature of an outer portion of first side 120, and curve 610 represents the temperature of a middle portion of first side 120. Curves 602, 604, 606, 608, and 610 show that the temperatures of ceramic base 110 and Wehnelt cap 112 become relatively stable in approximately 30 minutes after startup. FIG. 7 shows that the gap distance varies relative to the changes in temperature of ceramic base 110 and Wehnelt cap 112. The initial precipitous decrease in the gap distance results from expansion of cathode 102 and blocks 104. The subsequent increase in gap distance results from expansion of Wehnelt cap 112 and ceramic base 110. Filament posts 108 may also expand and thereby cause the gap distance to decrease. FIG. 7 demonstrates, however, that Wehnelt cap 112 and ceramic base 110 as compared to filament posts 108 expand more and at a faster rate. Other factors may also play a role in the gap distance response, such as electrical conduction losses through filament posts 108 and radiation losses. The model demonstrates that gap distance becomes relatively stable in approximately 20 minutes after startup.

Test Assembly

Figure 8:
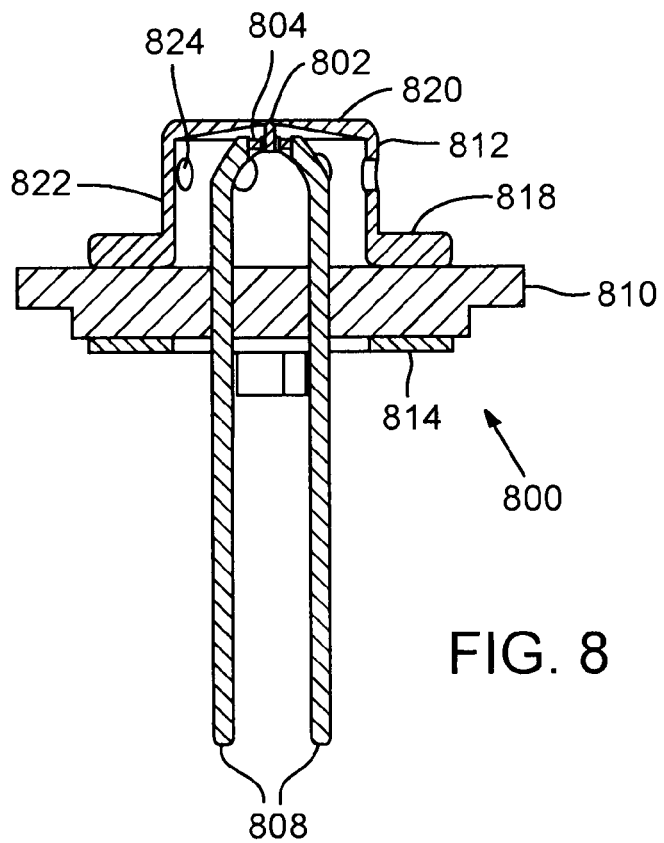
FIG. 8 is a cross-sectional view of a test thermionic emission assembly according to one embodiment.

FIG. 8 is a cross-sectional view of a test assembly 800 used to perform thermal analysis on a cathode 802, blocks 804, filament posts 808, a ceramic base 810, and a Wehnelt cap 812. (The last two digits of the three-digit reference numerals identifying corresponding component parts of test assembly 800 and thermionic emission assembly 100 are the same.) In a first embodiment of test assembly 800, Wehnelt cap 812 is made of Ti6Al4V and a side wall 822 has a thickness of about 0.5 mm. Side wall 822 of the first embodiment includes eight equally spaced holes 824 having diameters of approximately 1.6 mm. In a second embodiment of test assembly 800, Wehnelt cap 812 is made of Ti6Al4V and side wall 822 has a thickness of about 0.25 mm. Side wall 822 of the second embodiment includes four equally spaced windows (not shown) having dimensions of approximately 5.7 mm by 2.9 mm.

Figure 9:
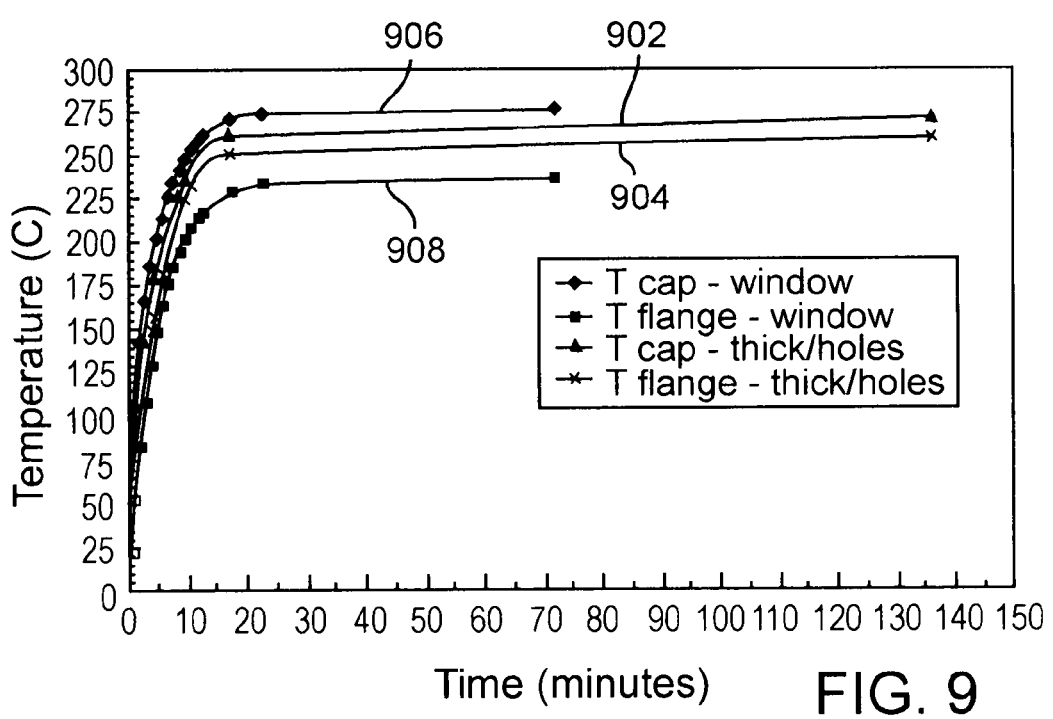
FIG. 9 is a graph of the operating temperatures of different embodiments of the test thermionic emission assembly.

FIG. 9 is a graph of the thermal results of tests performed on the first and second embodiments of test assembly 800. During the tests, an input power of 5.5 watts (W) was supplied to cathode 802 to heat it to approximately 1750 K. The final temperature of filament posts 808 was approximately 478.15 K. Curve 902 represents the temperature of a first side 820 of Wehnelt cap 812 of the first embodiment, and curve 904 represents the temperature of a flange 818 of Wehnelt cap 812 of the first embodiment. Curve 906 represents the temperature of first side 820 of Wehnelt cap 812 of the second embodiment, and curve 908 represents the temperature of flange 818 of Wehnelt cap 812 of the second embodiment. FIG. 9 demonstrates that Wehnelt caps 812 of the first and second embodiments heat up quickly and the temperatures become relatively stable in approximately 20 minutes after startup. FIG. 9 also demonstrates that first side 820 of the second embodiment as compared to first side 820 of the first embodiment is more thermally isolated from flange 818.

Figure 10:
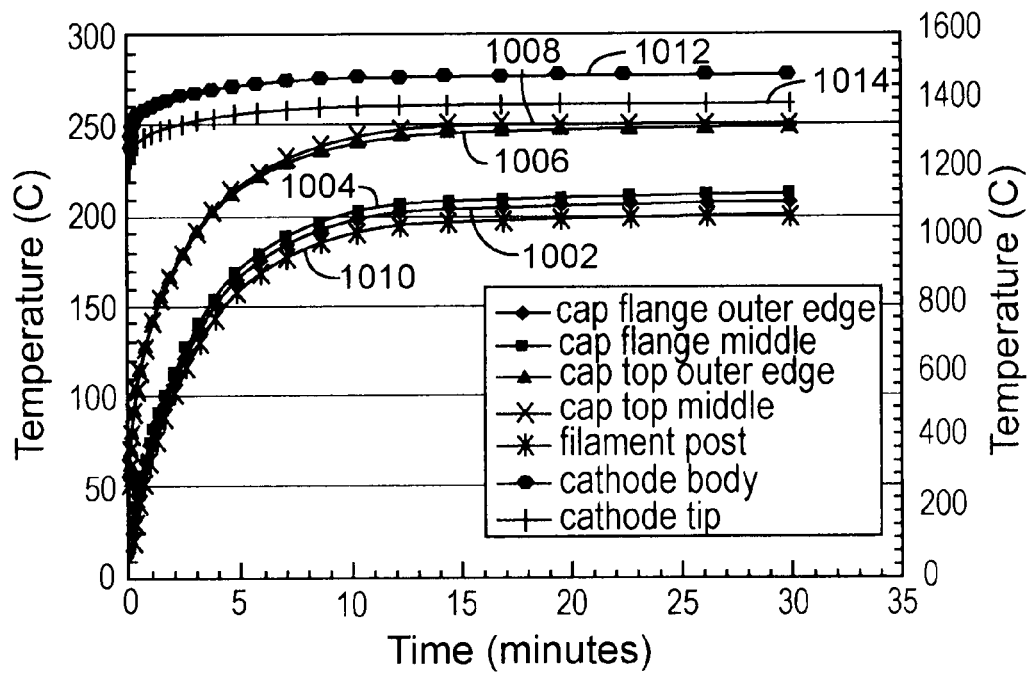
FIG. 10 is a graph of the operating temperatures of an embodiment of the test thermionic emission assembly calculated by a thermal modeling program.

A thermal modeling program was used to construct a thermal model for the first embodiment of test assembly 800. In the model, an input power of 5.5 W was supplied to cathode 802. FIG. 10 is a graph of the temperatures of cathode 802, filament posts 808, and Wehnelt cap 812 calculated for the model. In FIG. 10, the left side y-axis represents temperatures of Wehnelt cap 812 and filament posts 808, and the right side y-axis represents temperatures of cathode 802. Curves 1002, 1004, 1006, and 1008 represent the temperatures of various portions of Wehnelt cap 812. Specifically, curves 1002, 1004, 1006, and 1008 represent the temperatures of, respectively, an outer edge of flange 818, a middle portion of flange 818, an outer edge of first side 820, and a middle portion of first side 820. Curve 1010 represents the temperature of posts 808; and curves 1012 and 1014 represent the temperatures of, respectively, a middle portion of cathode 802 and an end portion of cathode 802. FIG. 10 demonstrates that the temperatures of cathode 802, filament posts 808, and Wehnelt cap 812 of the first embodiment of test assembly 800 stabilize relatively quickly compared to known electron sources.

Figure 11:
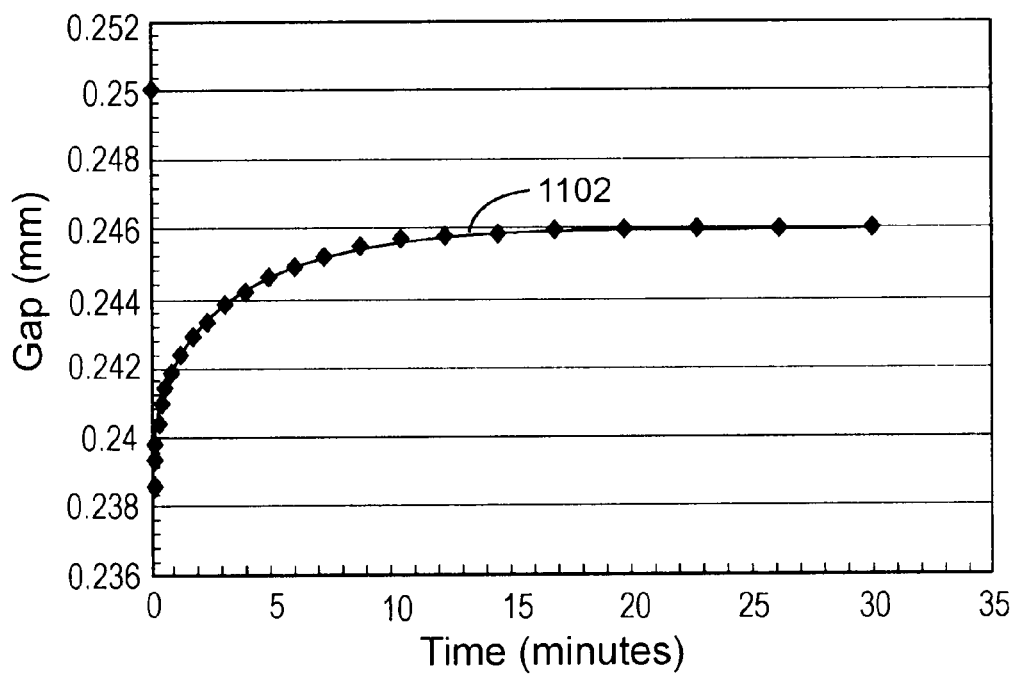
FIG. 11 is a graph of the gap distance between a cathode and Wehnelt cap of the test thermionic emission assembly according to one embodiment.

The thermal modeling program also calculated the change in the gap distance between the end portion of cathode 802 and first side 820 of Wehnelt cap 812 of the first embodiment of test assembly 800. The change in gap distance is represented by curve 1102 of FIG. 11. The gap distance variation corresponds to the temperature variation of cathode 802 and Wehnelt cap 812. The precipitous initial decrease in the gap distance results from expansion of cathode 802 and blocks 804. The subsequent increase in the gap distance results from expansion of Wehnelt cap 812 and ceramic base 810. Filament posts 808 may also expand and thereby cause the gap distance to decrease. Curve 1102 demonstrates, however, that Wehnelt cap 812 and ceramic base 810 as compared to filament posts 808 expand more and at a faster rate. Other factors may also play a role in the gap distance response, such as conduction losses through filament posts 808 and radiation losses. The model demonstrates that gap distance becomes relatively stable in 20 or fewer minutes after startup.

Figure 12:
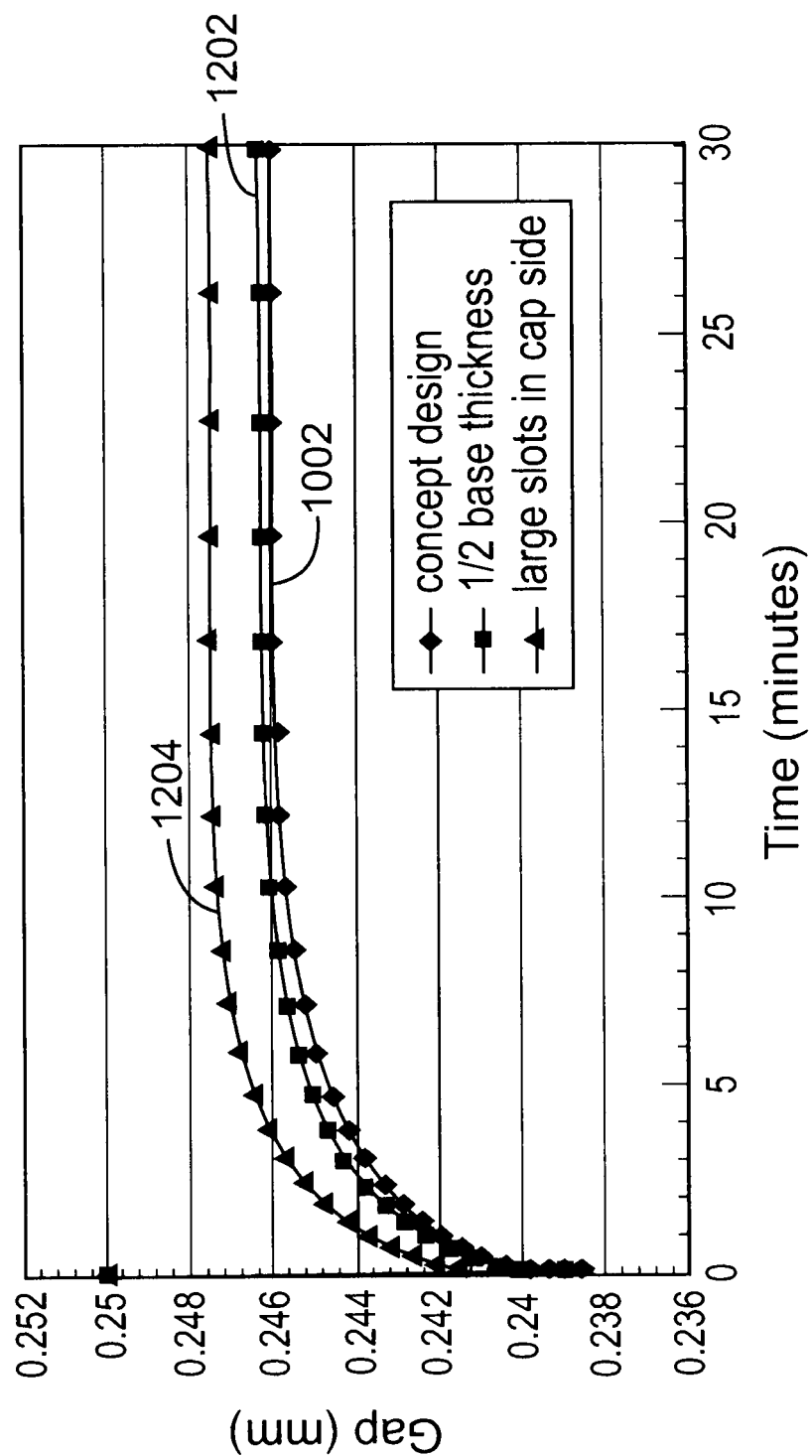
FIG. 12 is a graph of the gap distances between cathodes and Wehnelt caps of different embodiments of the test thermionic emission assembly.

FIG. 12 is a graph of the gap distances calculated by the thermal modeling program for alternative designs of Wehnelt cap 812 and ceramic base 810. Curve 1202 represents the gap distance of a design in which the thickness of ceramic base 810 has been reduced from that of the first embodiment of test assembly 800. Curve 1204 represents the gap of a design in which four windows (similar to the windows described in the second embodiment of test assembly 800) replace the eight holes 824 of the first embodiment. The alternative designs show more of a mismatch between the expansion of Wehnelt cap 812 and filament posts 808.

Combinations of the above embodiments, and other embodiments not specifically described herein will be apparent to skilled persons upon reviewing the above description. Though the present invention has been set forth in the form of the embodiments described above, it is nevertheless intended that modifications to the disclosed systems and methods may be made without departing from inventive concepts set forth herein.

The invention claimed is:

1. A thermionic emission assembly, comprising:
a Wehnelt cap having a cap beam aperture and an interior region within which a cathode is supported by multiple filament posts, the interior region defined by a side wall that encompasses the cathode and extends between a mounting side and a top side of the Wehnelt cap, the top side including the cap beam aperture, and the cathode, in response to applied electrical energy, reaching a sufficiently high temperature to emit a beam of electrons propagating through the cap beam aperture;
an anode having an anode beam aperture positioned in spatial alignment with the cap beam aperture to receive the electrons propagating through the cap beam aperture, the anode having a base portion that includes the anode beam aperture and a spacer member that extends from the base portion of the anode and encompasses the Wehnelt cap, and the anode accelerating the electrons and directing them through the anode beam aperture for incidence on a target specimen; and
a ceramic base operatively connected to the mounting side of the Wehnelt cap and the spacer member of the anode to form an integrated structure of which the multiple filament posts, Wehnelt cap, and anode are component parts, and the ceramic base positioned to form a combined electrical and thermal interface separating the filament posts, Wehnelt cap, and anode, the interface thermally isolating the Wehnelt cap from the anode to allow the Wehnelt cap to rapidly reach thermal equilibrium.

2. The thermionic emission assembly of claim 1, further comprising a cathode support structure to which the cathode is electrically connected and thermally isolated.

3. The thermionic emission assembly of claim 2, in which the cathode support structure comprises the multiple filament posts attached to the ceramic base and extending from different ones of multiple blocks holding the cathode, the blocks electrically connecting the filament posts to and thermally isolating the filament posts from the cathode.

4. The thermionic emission assembly of claim 1, further comprising a differential pumping aperture plate attached to the anode and having a differential pumping aperture that is axially aligned with the cap beam aperture and anode beam aperture.

5. The thermionic emission assembly of claim 1, in which the mounting side of the Wehnelt cap includes a flange to which the ceramic base is operatively connected by a first set of releasable fasteners, and in which the spacer member is operatively connected to the ceramic base by a second set of releasable fasteners; and further comprising a cathode support structure attached to the ceramic base and providing the support for the cathode within the interior region of the Wehnelt cap, the cathode support structure electrically connected to and thermally isolated from the cathode;

thereby to form the integrated structure that facilitates pre-alignment of the Wehnelt cap, cathode, and anode before installation of the thermionic emission assembly in an instrument that is operationally enabled by use of an electron beam.

6. The thermionic emission assembly of claim 5, in which the Wehnelt cap is made of titanium alloy.

7. The thermionic emission assembly of claim 5, in which the anode is made of titanium alloy.

8. The thermionic emission assembly of claim 1, further comprising an electron microscope in which the thermionic emission assembly is installed.

* * * * *